United States Patent
Harada et al.

(10) Patent No.: US 11,913,110 B2
(45) Date of Patent: Feb. 27, 2024

(54) RAW MATERIAL FOR CHEMICAL DEPOSITION CONTAINING ORGANORUTHENIUM COMPOUND, AND CHEMICAL DEPOSITION METHOD USING THE RAW MATERIAL FOR CHEMICAL DEPOSITION

(71) Applicant: TANAKA KIKINZOKU KOGYO K.K., Tokyo (JP)

(72) Inventors: Ryosuke Harada, Tsukuba (JP); Tomohiro Tsugawa, Tsukuba (JP); Shigeyuki Ootake, Tsukuba (JP); Teruhisa Iwai, Tsukuba (JP); Seung-Joon Lee, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 17/796,215

(22) PCT Filed: Jan. 28, 2021

(86) PCT No.: PCT/JP2021/002933
§ 371 (c)(1),
(2) Date: Jul. 28, 2022

(87) PCT Pub. No.: WO2021/153639
PCT Pub. Date: Aug. 5, 2021

(65) Prior Publication Data
US 2023/0102354 A1    Mar. 30, 2023

(30) Foreign Application Priority Data
Jan. 31, 2020  (JP) .................. 2020-014851

(51) Int. Cl.
C23C 16/18   (2006.01)
C07F 15/00   (2006.01)

(52) U.S. Cl.
CPC .......... *C23C 16/18* (2013.01); *C07F 15/0046* (2013.01)

(58) Field of Classification Search
CPC .................. C07F 15/0046; C01G 55/008
See application file for complete search history.

(56) References Cited

U.S. PATENT DOCUMENTS

| | | | | |
|---|---|---|---|---|
| 3,117,148 A * | 1/1964 | Ihrman | ............... | C07F 15/02 987/8 |
| 5,962,716 A | 10/1999 | Uhlenbrock et al. | | |
| 6,303,809 B1 | 10/2001 | Chi et al. | | |
| 6,465,669 B1 | 10/2002 | Okamoto | | |
| 8,920,875 B2 * | 12/2014 | Suzuki | ............. | H01L 21/28556 556/136 |
| 2011/0165780 A1 | 7/2011 | Kanjolia et al. | | |
| 2011/0318488 A1 | 12/2011 | Saito et al. | | |
| 2020/0339617 A1 | 10/2020 | Kim et al. | | |
| 2022/0018018 A1 | 1/2022 | Harada et al. | | |

FOREIGN PATENT DOCUMENTS

| | | |
|---|---|---|
| JP | 2000-281694 A | 10/2000 |
| JP | 2011-522124 A | 7/2011 |
| JP | 2012-006858 A | 1/2012 |
| JP | 2020-090689 A | 6/2020 |
| WO | WO-2019/088722 A1 | 5/2019 |
| WO | WO-2023021064 A1 * | 2/2023 |

OTHER PUBLICATIONS

Herberich et al. J. Chem. Soc. Dalton Trans. 1993, 2471-7476.*
Kim et al. Thin Solid Films 612 (2016) 122-127.*
G. Sbrana et al., 13 Journal of Organometallic Chemistry, 240-242 (1968) (Year: 1968).*

(Continued)

*Primary Examiner* — Alexander R Pagano
(74) *Attorney, Agent, or Firm* — Foley & Lardner LLP

(57) ABSTRACT

The present invention relates to a raw material of an organoruthenium compound for producing a ruthenium thin film or a ruthenium compound thin film by a chemical deposition method. This organoruthenium compound is an organoruthenium compound represented by the following Formula 1 and including a trimethylenemethane-based ligand ($L_1$) and three carbonyl ligands coordinated to divalent ruthenium. In Formula 1, the trimethylenemethane-based ligand $L_1$ is represented by the following Formula 2:

$$RuL_1(CO)_3$$   [Formula 1]

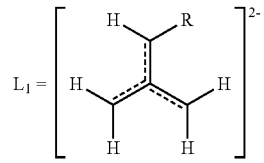

[Formula 2]

wherein a substituent R of the ligand $L_1$ is hydrogen, or any one of an alkyl group, a cyclic alkyl group, an alkenyl group, an alkynyl group, and an amino group having a predetermined number of carbon atoms.

11 Claims, 5 Drawing Sheets

(56) References Cited

OTHER PUBLICATIONS

International Searching Authority, "International Search Report," issued in connection with International Patent Application No. PCT/JP2021/002933, dated Mar. 9, 2021.
International Searching Authority, "Written Opinion," issued in connection with International Patent Application No. PCT/JP2021/002933, dated Mar. 9, 2021.
Chung et al., "Electrical and Structural Properties of Ruthenium Film Grown by Atomic Layer Deposition using Liquid-Phase $Ru(CO)_3$ $(C_6H_8)$ Precursor," Materials Research Society Symposia Proceedings, vol. 990, 2007 (8 pages).
Office Action issued in corresponding Japanese Patent Application No. 2021-574085, dated Feb. 27, 2023.

\* cited by examiner

RAW MATERIAL FOR CHEMICAL DEPOSITION CONTAINING ORGANORUTHENIUM COMPOUND, AND CHEMICAL DEPOSITION METHOD USING THE RAW MATERIAL FOR CHEMICAL DEPOSITION

CROSS-REFERENCE TO RELATED APPLICATIONS

The present application claims priority under 37 U.S.C. § 371 to International Patent Application No. PCT/JP2021/002933, filed Jan. 28, 2021, which claims priority to and the benefit of Japanese Patent Application No. 2020-014851, filed on Jan. 31, 2020. The contents of these applications are hereby incorporated by reference in their entireties.

BACKGROUND OF THE INVENTION

Field of the Invention

The present invention relates to a raw material for chemical deposition containing an organoruthenium compound for producing a ruthenium thin film or a ruthenium compound thin film by a chemical deposition method (chemical vapor deposition (CVD) or atomic layer deposition (ALD)). More particularly, it relates to a raw material for chemical deposition having a low decomposition temperature and adequate thermal stability.

Description of the Related Art

Thin films containing ruthenium or a ruthenium compound are used as wiring/electrode materials of semiconductor devices such as a DRAM and an FERAM. As a method for producing such a thin film, a chemical deposition method such as CVD (chemical vapor deposition) or ALD (atomic layer deposition) is applied. As a raw material (precursor) used in such a chemical deposition method, a large number of organoruthenium compounds have been conventionally known.

As an organoruthenium compound used as a raw material for chemical deposition, for example, Patent Document 1 discloses bis(ethylcyclopentadienyl)ruthenium (II) represented by Formula 1 and including cyclopentadienyl, that is, a cyclic dienyl, or a derivative thereof coordinated. This organoruthenium compound is known as a raw material compound for chemical deposition from a comparatively long time ago.

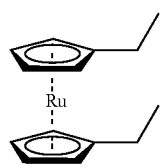

[Formula 1]

(1,3-Cyclohexadiene)tricarbonyl ruthenium of Formula 2 using cyclohexadienyl and carbonyl as ligands is also useful as the organoruthenium compound used as a raw material for chemical deposition (Patent Document 3, and Non Patent Document 1).

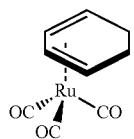

[Formula 2]

In addition, an organoruthenium compound in which a β-diketonato ligand is applied as a ligand coordinating to ruthenium is also useful. For example, known from Patent Document 2 are dicarbonyl-bis(tetramethylheptanedionate) ruthenium represented by Formula 3 and including tetramethylheptanedionate and carbonyl coordinated, and tris(acetylacetonato)ruthenium of Formula 4 including three acetylacetonato coordinated as β-diketonato ligands. Patent Document 4 discloses dicarbonyl-bis(5-methyl-2,4-hexanediketonato)ruthenium represented by Formula 5.

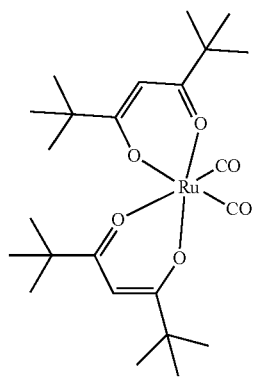

[Formula 3]

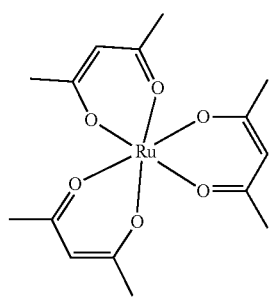

[Formula 4]

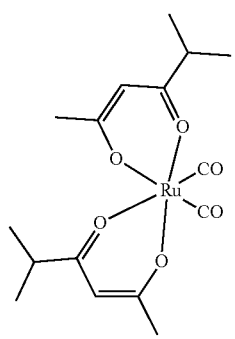

[Formula 5]

PRIOR ART DOCUMENT

Patent Document

Patent Document 1
Japanese Patent Application Laid-Open No: 2000-281694
Patent Document 2
U.S. Pat. No. 6,303,809
Patent Document 3
U.S. Pat. No. 5,962,716
Patent Document 4
Japanese Patent Application Laid-Open No. 2012-006858

Non Patent Document

Non Patent Document 1
Materials Research Society Symposium B-Materials, Processes, Integration and Reliability in Advanced Interconnects for Micro- and Nanoelectronics, 2007, 990. 0990-B08-01

SUMMARY OF THE INVENTION

Technical Problem

Properties required of an organoruthenium compound for chemical deposition have been mainly basic properties in thin film formation, such as possibility/efficiency of ruthenium thin film formation, and handleability as a raw material. A chemical deposition method is a method including vaporizing a raw material compound to obtain a raw material gas, transporting the raw material gas onto a substrate, and decomposing the raw material gas on the substrate to form a thin film. In this process, it is necessary to rapidly vaporize the raw material compound, and therefore, a compound that has a vaporization property with a high vapor pressure so as to easily vaporize to a raw material gas has been regarded as favorable.

In accordance with increase in electrode/wire density and increase in resolution in various semiconductor devices, properties required of an organoruthenium compound used as a raw material for chemical deposition have become diverse.

One of such property requirements is expansion of an applicable range of reaction gases usable in film formation process. Since an organoruthenium compound decomposes by heating, ruthenium can be deposited from a single compound. In order to decompose the compound at an appropriate film forming temperature to ensure a deposition rate, however, a reaction gas is introduced together with a raw material in general. As the reaction gas, oxygen is used in many cases. In next generation semiconductor devices, however, antioxidation of a thin film and an underlying substrate is demanded. In order to prevent oxidation of a thin film and a substrate in film formation by a chemical deposition method, a reducing gas such as hydrogen is preferably used as the reaction gas. In other words, an organoruthenium compound having high reactivity even in the presence of a reducing gas such as hydrogen is demanded.

The above-described conventional organoruthenium compounds meet the basic property requirements, but are difficult to cope with widening of the applicable range of reaction gasses and the requirements in thermal stability. For example, the organoruthenium compound of Formula 1 has a high vapor pressure, and is excellent in handleability because it is in a liquid state at normal temperature, and hence has been a useful organoruthenium compound under conventional film forming conditions. It is, however, necessary to use oxygen as the reaction gas for this organoruthenium compound, and hence the requirement in antioxidation of a substrate cannot be met.

The organoruthenium compound of Formula 2 is a compound having a high vapor pressure, and hence is a favorable compound under the conventional film forming conditions. In addition, a hydrogen gas can be used as the reaction gas for this organoruthenium compound. This organoruthenium compound is, however, insufficient in reactivity with a hydrogen gas, and also has a problem of thermal stability. A compound having low thermal stability decomposes in a portion apart from a substrate surface, and hence a raw material is difficult to be stably supplied, which lowers the yield and deteriorates the handleability. Therefore, an organoruthenium compound having adequately high thermal stability is demanded.

As for the above-described organoruthenium compounds of Formula 3, Formula 4 and Formula 5, a range of choice of the reaction gas is comparatively wide, and it is deemed that a hydrogen gas can be used. In these organoruthenium compounds, however, the β-diketonato ligand used as the ligand contains an oxygen atom in the structure, and this oxygen atom directly coordinates to ruthenium that is a metal atom. The organoruthenium compound containing β-diketonato ligand having an oxygen atom directly coordinating to a ruthenium atom has insufficient reactivity with a hydrogen gas, and the oxygen atom contained in the ligand may mix in a ruthenium thin film in some cases. Also when oxygen is used as the reaction gas, oxygen may mix in a ruthenium thin film. The mixture of oxygen in a ruthenium thin film is also mentioned in Patent Document 2, and it is revealed that a ruthenium thin film contains about 3% of oxygen. The oxygen thus mixing in the ruthenium thin film may affect properties of electrode materials, for example, may increase specific resistance in some cases. Besides, since the reactivity with a hydrogen gas of these organoruthenium compounds is actually not sufficient, these compounds are not suitable for efficient film formation in the presence of a hydrogen gas. Therefore, also in the film formation using the organoruthenium compounds of Formula 3, Formula 4 and Formula 5, an oxygen gas is used in many cases.

As described so far, raw materials for chemical deposition containing the conventional organoruthenium compounds do not always cope with the diversifying property requirements. Therefore, the present invention provides an organoruthenium compound having favorable reactivity also with a reducing gas such as a hydrogen gas, and having adequate thermal stability, with the basic properties as a raw material for chemical deposition such as a vaporization property and handleability regarded as significant.

Solution to Problem

The present invention that solves the above-described problems is directed to a raw material for chemical deposition for producing a ruthenium thin film or a ruthenium compound thin film by a chemical deposition method, containing an organoruthenium compound represented by the following Formula 6 and including a trimethylenemethane-based ligand ($L_1$) and three carbonyl ligands coordinated to divalent ruthenium.

$$RuL_1(CO)_3 \qquad \text{[Formula 6]}$$

In Formula 6, the trimethylenemethane-based ligand $L_1$ is represented by the following Formula 7.

[Formula 7]

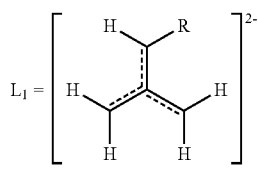

In Formula 7, a substituent R of the ligand $L_1$ is any one of hydrogen, a linear or branched alkyl group having 1 or more and 8 or less carbon atoms, a cyclic alkyl group having 3 or more and 9 or less carbon atoms, a linear or branched alkenyl group having 2 or more and 8 or less carbon atoms, a linear or branched alkynyl group having 2 or more and 8 or less carbon atoms, a linear or branched amino group having 2 or more and 8 or less carbon atoms, and an aryl group having 6 or more and 9 or less carbon atoms.

The organoruthenium compound contained in the raw material for chemical deposition of the present invention is characterized in that the trimethylenemethane-based ligand ($L_1$) is applied as the ligand. In the present invention, the trimethylenemethane-based ligand refers to a ligand containing trimethylenemethane ($\eta^4$-methylene-1,3-propanediyl), or a ligand containing a trimethylenemethane derivative obtained by introducing a substituent into trimethylenemethane. As compared with ligands of conventional organoruthenium compounds for chemical deposition, the trimethylenemethane-based ligand has the following advantages.

Trimethylenemethane used as a base of the trimethylenemethane-based ligand is a tridentate ligand having fewer carbon skeletons containing carbon and hydrogen. Therefore, this ligand does not contain an element that can be an impurity in a ruthenium thin film. In particular, the trimethylenemethane-based ligand does not contain an oxygen atom capable of directly coordinating to ruthenium differently from a β-diketonato ligand. In addition, this ligand has good reactivity with a hydrogen gas as described later, and hence mixture of oxygen in the ruthenium thin film and oxidation of an underlying substrate are not liable to occur. According to the present invention, a high quality ruthenium thin film can be formed with the oxygen mixture in the film and substrate oxidation suppressed.

The trimethylenemethane-based ligand is a ligand coordinating to divalent ruthenium. On the contrary, a ligand of hexadiene of Formula 2 or the like is a ligand coordinating to zero-valent ruthenium. Here, a complex containing divalent ruthenium is liable to have higher binding strength to a ligand as compared with a complex containing zero-valent ruthenium. Accordingly, the organoruthenium compound of the present invention is a compound having adequately high thermal stability.

The organoruthenium compound containing higher-valent (divalent) ruthenium is improved in reactivity with a hydrogen gas as compared with that of prior art. Therefore, for the organoruthenium compound of the present invention, a reducing gas such as hydrogen can be applied as a reaction gas.

The organoruthenium compound of the present invention has a structural advantage of a complex and high reactivity in a reducing atmosphere of hydrogen or the like as described above, and hence a problem of the quality of a substrate and a ruthenium thin film is solved. In addition, since adequate thermal stability is ensured, efficient film formation free from loss can be performed.

In addition, the organoruthenium compound of the present invention is also good in a high vapor pressure, that is, a property required as prerequisite of a raw material for chemical deposition. The vapor pressure of an organoruthenium compound is liable to correspond to a molecular weight of a ligand. The trimethylenemethane-based ligand is a ligand having fewer carbon skeletons and having a low molecular weight. Besides, the carbonyl ligand coordinating to ruthenium together with the trimethylenemethane-based ligand also has a low molecular weight, and hence this compound is a compound that has a high vapor pressure and easily vaporizes.

The organoruthenium compound used as the raw material for chemical deposition of the present invention having a large number of advantages as described above will be described in detail. Now, the ligands (the trimethylenemethane-based ligand ($L_1$) and the carbonyl ligand) coordinating to ruthenium (divalent) corresponding to a central metal, and specific examples of the organoruthenium compound of the present invention will be described.

(A) Trimethylenemethane-Based Ligand ($L_1$)

The organoruthenium compound applied in the present invention is characterized in that the trimethylenemethane-based ligand ($L_1$) is applied as a ligand.

In the present invention, trimethylenemethane is applied as the trimethylenemethane-based ligand ($L_1$) because trimethylenemethane possesses a plurality of properties preferable as a constituent element of a raw material for chemical deposition as described above. The raw material for chemical deposition of the present invention is good in thermal stability and reactivity, and has a vaporization property with a high vapor pressure so as to easily vaporize to a raw material gas.

In the present invention, a trimethylenemethane derivative is applied, in addition to trimethylenemethane, as the trimethylenemethane-based ligand. A substituent is introduced into trimethylenemethane because a melting point can be lowered and a decomposition temperature and the vaporization property can be adjusted by imparting asymmetry to a complex structure. When a melting point is lowered, a raw material for chemical deposition in a liquid state at normal temperature can be obtained. When a decomposition temperature is adjusted, adequate thermal stability can be obtained, and when the vaporization property is adjusted, efficient film formation can be performed. In other words, when a trimethylenemethane derivative is applied, handleability more preferable as a material for chemical deposition, and thermal stability for stable and efficient film formation can be obtained.

In the present invention, when the trimethylenemethane derivative is applied as the trimethylenemethane-based ligand, the substituent R is any one of a linear or branched alkyl group having 1 or more and 8 or less carbon atoms, a cyclic alkyl group having 3 or more and 9 or less carbon atoms, a linear or branched alkenyl group having 2 or more and 8 or less carbon atoms, a linear or branched alkynyl group having 2 or more and 8 or less carbon atoms, a linear or branched amino group having 2 or more and 8 or less carbon atoms, and an aryl group having 6 or more and 9 or less carbon atoms.

The substituent R is limited to the above-described hydrocarbon groups mainly containing carbon and hydrogen for excluding an element not preferable for a ruthenium thin film, such as oxygen, from constituent elements of the compound.

The number of carbon atoms of the hydrocarbon group of the substituent R is limited for making the vaporization property favorable in consideration of the thermal stability of the organoruthenium compound.

In order to ensure thermal stability necessary in the present invention, the decomposition temperature is preferably set to be high to some extent. In general, when a hydrocarbon group is introduced into a ligand in a metal complex applied to chemical deposition, the decomposition temperature is liable to increase as the number of carbon atoms of the hydrocarbon group is increased. Therefore, equal to or more than a predetermined number of carbon atoms are necessary for ensuring thermal stability, but an excessively high decomposition temperature is not preferable in consideration of influence on a substrate and the like. Besides, a factor for determining the decomposition temperature is not limited to the number of carbon atoms. The decomposition temperature of a complex can be affected by the presence of a branched chain, the presence of a double bond/triple bond, a three-dimensional structure and the like. The number of carbon atoms of the substituent is limited for adjusting the thermal stability in consideration of these factors.

Further, when a hydrocarbon group having an appropriate number of carbon atoms is introduced into trimethylenemethane, the vaporization property of the organoruthenium compound can be adjusted. When the molecular weight of the compound is increased by increasing the number of carbon atoms of the substituent, however, the vapor pressure lowers in many cases. The number of carbon atoms of the hydrocarbon group used as the substituent needs to be limited also for setting the vaporization property such as the vapor pressure in a favorable range.

For these reasons, in the present invention, the number of carbon atoms of the substituent R (an alkyl group, an alkenyl group, an alkynyl group, an amino group, or an aryl group) is set as described above in comprehensive consideration of the thermal stability (decomposition temperature) and various properties such as the vaporization property. Examples of the hydrocarbon group more preferable as the substituent R include a linear or branched alkyl group having 2 or more and 4 or less carbon atoms, a cyclic alkyl group having 5 or more and 8 or less carbon atoms, a linear or branched alkenyl group having 3 or more and 5 or less carbon atoms, a linear or branched alkynyl group having 3 or more and 5 or less carbon atoms, a linear or branched amino group having 3 or more and 5 or less carbon atoms, and an aryl group having 6 or more and 8 or less carbon atoms.

Specific examples of the substituent R include a methyl group, an ethyl group, a n-propyl group, an isopropyl group, a n-butyl group, an isobutyl group (2-methylpropyl), a sec-butyl group (1-methylpropyl), a tert-butyl group (1,1-dimethylethyl), a n-pentyl group, an isopentyl group (3-methylbutyl), a neopentyl group (2,2-dimethylpropyl), a sec-pentyl group (1-methylbutyl), a tert-pentyl group (1,1-dimethylpropyl), a n-hexyl group, an isohexyl group (4-methylpentyl), a neohexyl group (2,2-dimethylbutyl), a sec-hexyl group (1-methylpentyl), a tert-hexyl group (1,1-dimethylpentyl), a cyclohexyl group, a cyclohexylmethyl group, a cyclohexylethyl group, a phenyl group and a benzyl group. More preferable examples include an ethyl group, a n-propyl group, a n-butyl group, an isobutyl group (2-methylpropyl), a n-pentyl group, an isopentyl group (3-methylbutyl), and a neopentyl group (2,2-dimethylpropyl). Among these specific examples, the particularly preferable substituent R is any one of a methyl group, an ethyl group, a n-propyl group, an isopropyl group, a n-butyl group, an isobutyl group, a sec-butyl group, a tert-butyl group, a n-pentyl group, an isopentyl group, and a neopentyl group.

(B) Carbonyl Ligand

In the organoruthenium compound applied in the present invention, three carbonyl ligands are applied as ligands coordinating to ruthenium together with the trimethylenemethane-based ligand ($L_1$). A carbonyl ligand is also good in binding strength to ruthenium, and can improve the thermal stability of the entire complex. Besides, a carbonyl ligand is also a ligand having a low molecular weight, and can make better the vaporization property of the compound.

(C) Specific Examples of Organoruthenium Compound of Present Invention

Preferable specific examples of the organoruthenium compound contained in the raw material for chemical deposition of the present invention include compounds represented by the following Formulas 8, and it is noted that the present invention is not limited to these compounds.

[Formula 8]

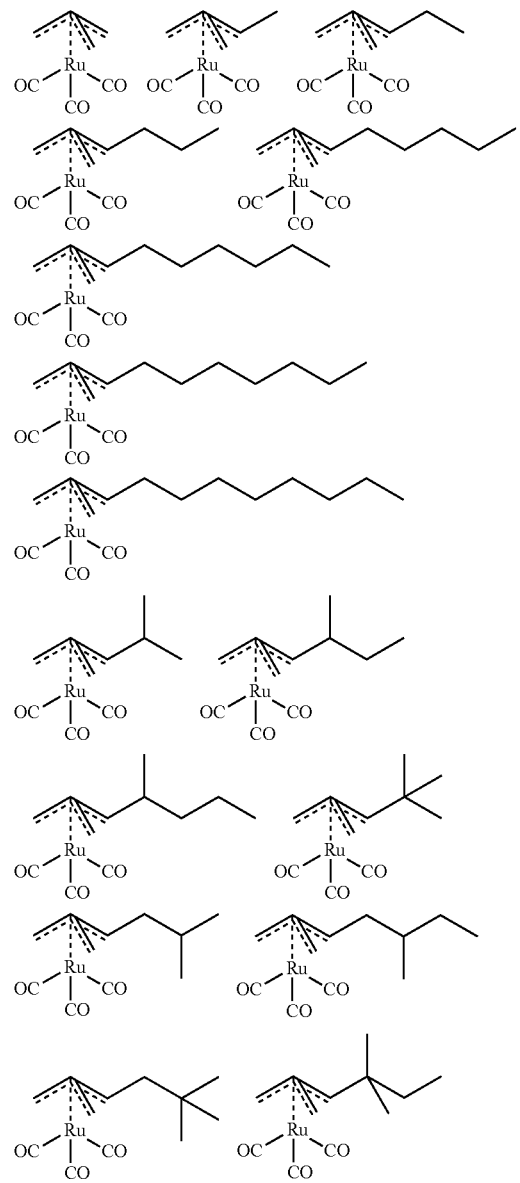

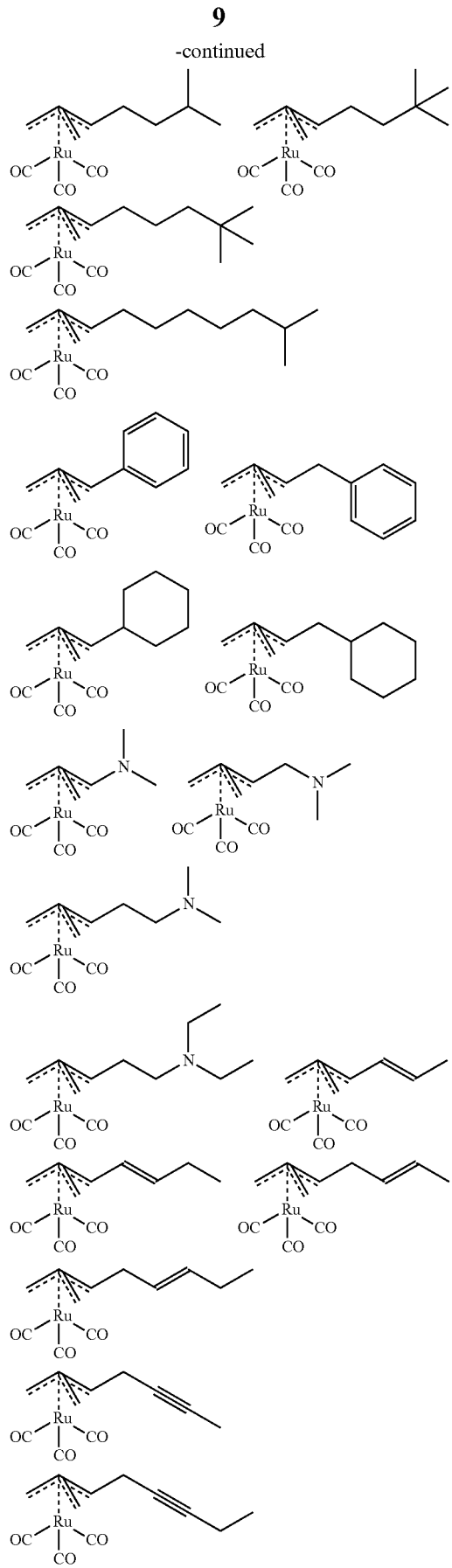

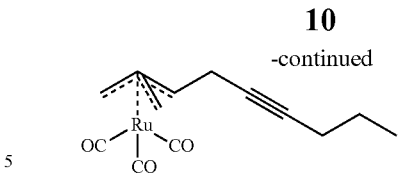

Next, a chemical deposition method for a ruthenium thin film or a ruthenium compound thin film in which the raw material for chemical deposition of the present invention is applied will be described. The chemical deposition method of the present invention includes vaporizing the raw material containing the organoruthenium compound described above by heating to thereby generate a raw material gas, and transporting the raw material gas onto a substrate surface, and thermally decomposing the organoruthenium compound to form a ruthenium thin film.

Regarding the form of the raw material in the chemical deposition method, the organoruthenium compound applied in the present invention has a high vapor pressure, and hence can easily vaporize to a raw material gas. Besides, a solution obtained by dissolving it in an appropriate solvent can be heated to obtain a raw material gas. A heating temperature for the raw material at this point is preferably 0° C. or more and 150° C. or less.

The vaporized raw material is joined with an appropriate carrier gas to be transported onto a substrate. In using the organoruthenium compound of the present invention, a ruthenium film can be formed with an inert gas (argon, nitrogen or the like) used as a carrier gas without using a reaction gas. For efficiently forming a ruthenium thin film, however, a reaction gas is preferably applied. Therefore, the raw material gas is preferably transported onto the substrate together with the reaction gas. It is noted that the reaction gas can work also as a carrier gas, and hence, the application of the carrier gas of the inert gas or the like is not always necessary.

The raw material gas is transported together with the reaction gas to a reactor, and is heated on a substrate surface to form a ruthenium thin film thereon. In the film formation using the raw material for chemical deposition of the present invention, a reducing gas such as hydrogen can be used as the reaction gas. As the reducing gas, not only hydrogen but also a gas of ammonia, hydrazine, formic acid, an alcohol (methanol, ethanol, or isopropanol) or the like can be applied.

In the film formation of a ruthenium thin film or the like using the organoruthenium compound of the present invention, an oxidizing gas or a gas of an oxygen-containing reactant can be applied as the reaction gas. As described above, an oxidizing gas such as oxygen can cause substrate oxidation and oxygen mixture in a thin film, but if there is no need to concern for these, the film formation can be efficiently performed by using the oxidizing gas or the like as the reaction gas. Besides, in using the organoruthenium compound of the present invention, an oxide is comparatively liable not to be formed even when oxygen or the like is used as the reaction gas. Therefore, the oxidizing gas such as oxygen is also useful as the reaction gas. As the oxidizing gas, oxygen, ozone and the like can be used. Besides, the oxygen-containing reactant refers to a compound containing an oxygen atom as a constituent element, and having activity in a decomposition reaction of the organoruthenium compound. As the reaction gas of an oxygen-containing reactant, water, an alcohol or the like in the form of a gas can be used.

A film forming temperature employed in the film formation is preferably 150° C. or more and 350° C. or less. When the temperature is less than 150° C., the decomposition reaction of the organoruthenium compound is difficult to proceed, and hence the film formation cannot be efficiently performed. Meanwhile, when the film forming temperature is high beyond 350° C., it is difficult to form a uniform film, and in addition, there may arise a problem of damage of the substrate or the like. It is noted that the film forming temperature is usually adjusted in accordance with a substrate heating temperature.

Advantageous Effects of Invention

An organoruthenium compound contained a raw material for chemical deposition of the present invention has good reactivity with a hydrogen gas or the like owing to selection of a ligand coordinating to ruthenium. Besides, the organoruthenium compound of the present invention has adequate thermal stability. According to the present invention, a high quality ruthenium thin film can be formed in a reducing atmosphere of a hydrogen gas or the like, and substrate oxidation and oxygen mixture in the thin film can be suppressed at a high level.

The ligand of the organoruthenium compound of the present invention is a favorable structure also from the viewpoint of a vapor pressure or the like. Accordingly, a vaporization property conventionally required of a raw material for chemical deposition is also good. In this manner, the raw material for chemical deposition of the present invention is useful in electrode formation in a recent highly refined semiconductor device.

DETAILED DESCRIPTION OF THE PREFERRED EMBODIMENTS

Figure 1:
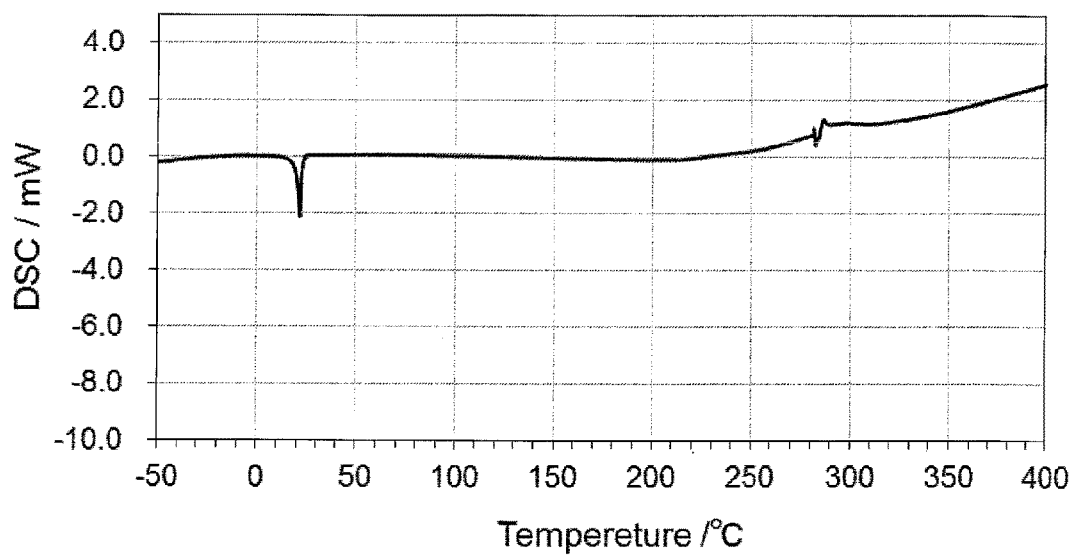
FIG. 1 is a diagram illustrating a DSC measurement result of an organoruthenium compound of Example 1.
Figure 2:
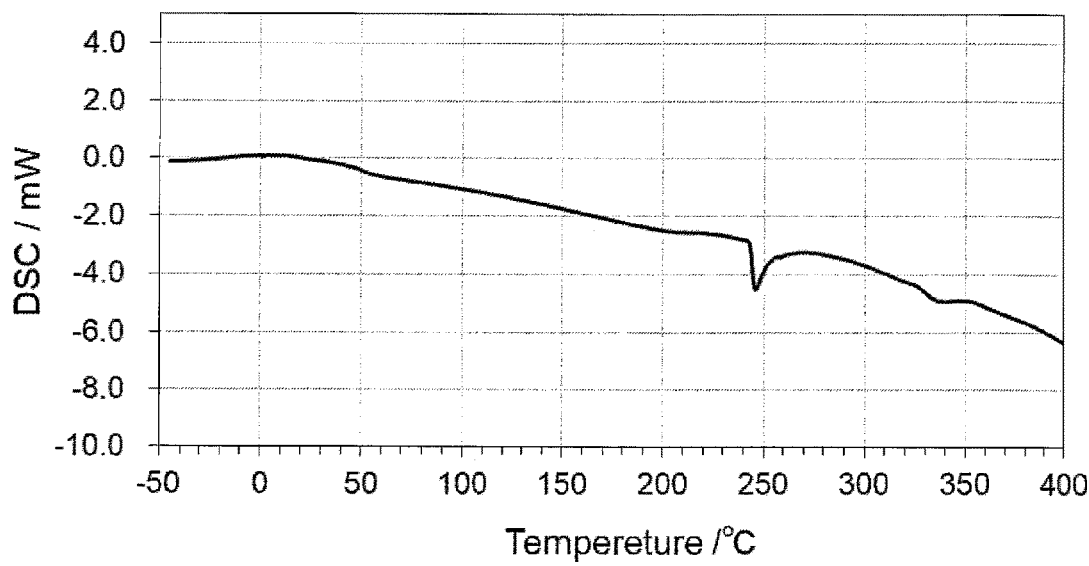
FIG. 2 is a diagram illustrating a DSC measurement result of an organoruthenium compound of Example 2.
Figure 3:
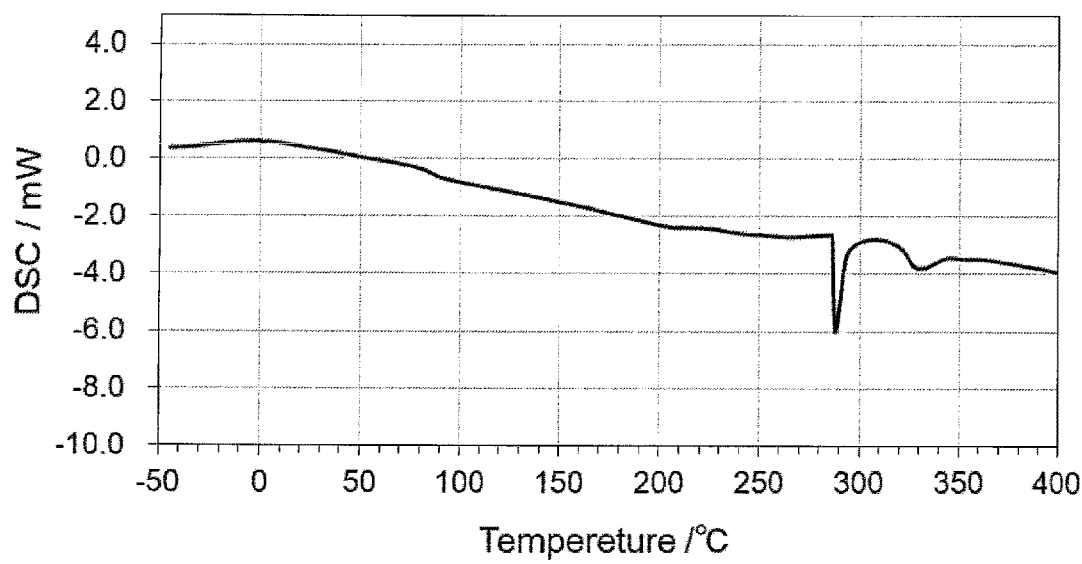
FIG. 3 is a diagram illustrating a DSC measurement result of an organoruthenium compound of Example 3.
Figure 4:
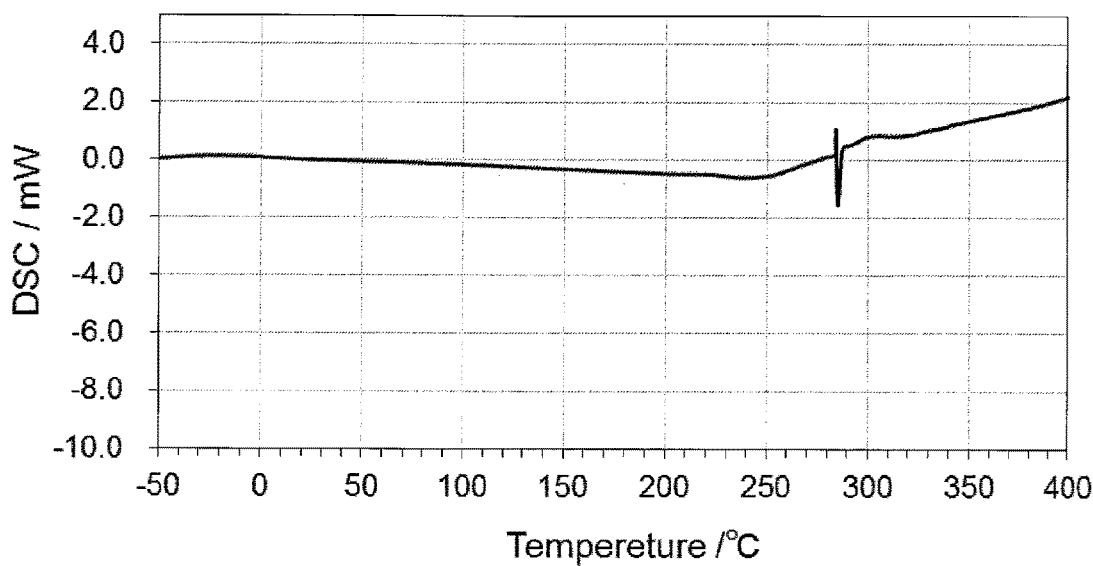
FIG. 4 is a diagram illustrating a DSC measurement result of an organoruthenium compound of Example 4.
Figure 5:
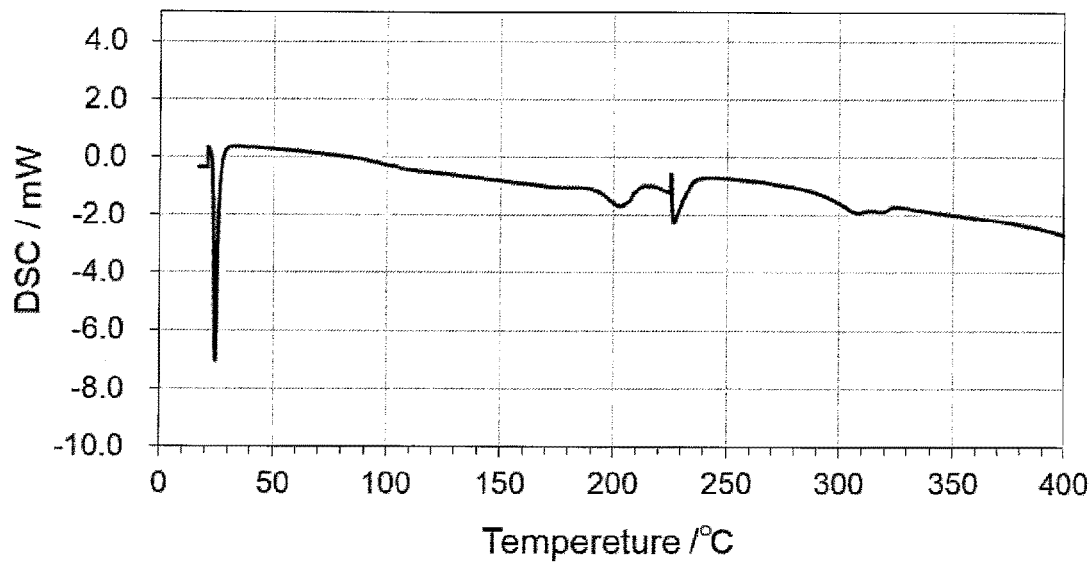
FIG. 5 is a diagram illustrating a DSC measurement result of an organoruthenium compound of Comparative Example 1.

First Embodiment: Now, a preferred embodiment of the present invention will be described. In the present embodiment, it was checked whether or not an organoruthenium compound of the present invention could be synthesized.

Here, organoruthenium compounds in which trimethylenemethane (Example 1) coordinated as a trimethylenemethane-based ligand ($L_1$), and in which trimethylenemethane-based ligands respectively having a substituent R of an ethyl group (Example 2), a propyl group (Example 3), an isobutyl group (Example 4), and an octyl group (Example 5) coordinated were synthesized. These organoruthenium compounds were evaluated for physical properties, and in addition, were used for performing a film formation test of a ruthenium thin film.

Synthesis of Organoruthenium Compound

Example 1: Synthesis of ($\eta^4$-methylene-1,3-propanediyl)tricarbonyl Ruthenium 50.0 g (97.5 mmol) of tricarbonyl-dichlororuthenium dimer was suspended in 1400 ml of tetrahydrofuran, and 300 ml of a solution of 27.0 g (214.5 mmol) of 3-chloro-2-(chloromethyl)-1-propene in tetrahydrofuran was added thereto. To the resultant, 12.0 g (479 mmol) magnesium turnings were slowly added, followed by stirring at room temperature for 8 hours. To the resultant reaction mixture, 10 mL of methanol was added for quenching, and the solvent was distilled off under reduced pressure. The thus obtained residue was extracted with 500 mL of pentane once, and subsequently with 250 mL of pentane twice, and the solvent was distilled off under reduced pressure. The thus obtained oil was purified by sublimation to obtain 17.0 g (71.1 mmol) of a colorless liquid as a target (yield: 36%). The synthesis reaction is as follows:

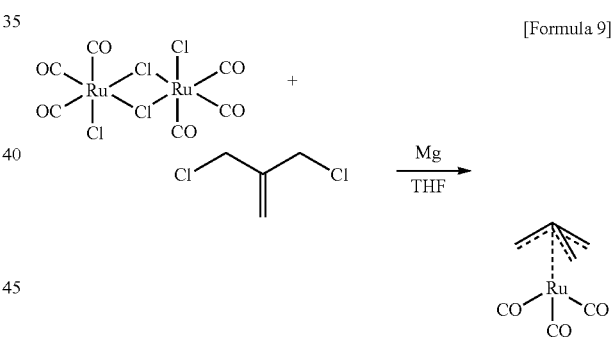

[Formula 9]

Example 2: Synthesis of ($\eta^4$-2-propylidene-1-yl,3-propanediyl)tricarbonyl Ruthenium 12.2 g (24.0 mmol) of tricarbonyl-dichlororuthenium dimer was suspended in 420 ml of tetrahydrofuran, and 100 ml of a solution of 82.0 g (53.6 mmol) of 1-chloro-2-(chloromethyl)-2-pentene in tetrahydrofuran was added thereto. To the resultant, 4.4 g (192 mmol) magnesium turnings were slowly added, followed by stirring at room temperature for 3 hours. To the resultant reaction mixture, 12 mL of methanol was added for quenching, and the solvent was distilled off under reduced pressure. The thus obtained residue was extracted with 30 mL of pentane three times, and the solvent was distilled off under reduced pressure. The thus obtained oil was purified by distillation to obtain 4.84 g (18.1 mmol) of a colorless liquid as a target (yield: 38%). The synthesis reaction performed in this example is as follows:

[Formula 10]

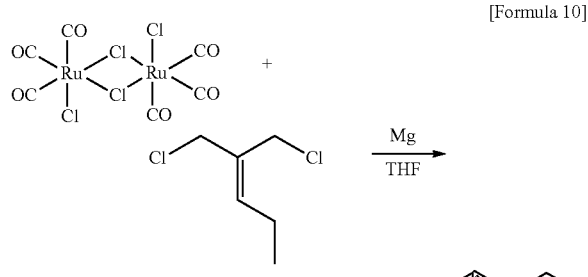

Example 3: Synthesis of ($\eta^4$-2-butylidene-1,3-propanediyl)tricarbonyl Ruthenium 6.12 g (12.0 mmol) of tricarbonyl-dichlororuthenium dimer was suspended in 200 ml of tetrahydrofuran, and 50 ml of a solution of 4.81 g (28.8 mmol) of 1-chloro-2-(chloromethyl)-2-hexene in tetrahydrofuran was added thereto. To the resultant, 22.7 g (96.0 mmol) magnesium turnings were slowly added, followed by stirring at room temperature for 3 hours. To the resultant reaction mixture, 6 mL of methanol was added for quenching, and the solvent was distilled off under reduced pressure. The thus obtained residue was extracted with 30 mL of pentane three times, and the solvent was distilled off under reduced pressure. The thus obtained oil was purified by distillation to obtain 27.9 g (9.92 mmol) of a colorless liquid as a target (yield: 41%). The synthesis reaction performed in this example is as follows:

[Formula 11]

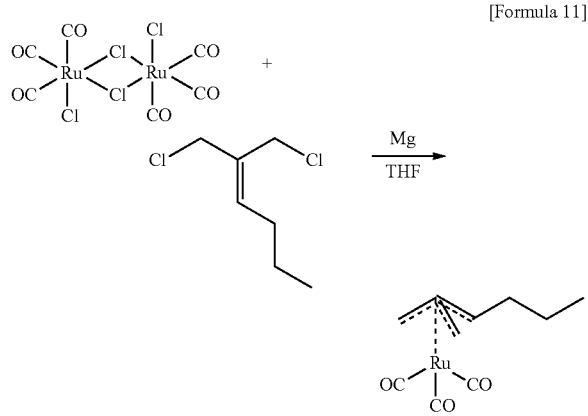

Example 4: Synthesis of ($\eta^4$-2-(3-methylbutylidene-1,3-propanediyl)tricarbonyl Ruthenium 6.12 g (12.0 mmol) of tricarbonyl-dichlororuthenium dimer was suspended in 200 ml of tetrahydrofuran, and 50 ml of a solution of 5.21 g (28.8 mmol) of 1-chloro-2-(chloromethyl)-5-methyl-2-hexene in tetrahydrofuran was added thereto. To the resultant, 2.2 g (96.0 mmol) magnesium turnings were slowly added, followed by stirring at room temperature for 3 hours. To the resultant reaction mixture, 6 mL of methanol was added for quenching, and the solvent was distilled off under reduced pressure. The thus obtained residue was extracted with 30 mL of pentane three times, and the solvent was distilled off under reduced pressure. The thus obtained oil was purified by distillation to obtain 2.12 g (7.18 mmol) of a colorless liquid as a target (yield: 30%). The synthesis reaction performed in this example is as follows:

[Formula 12]

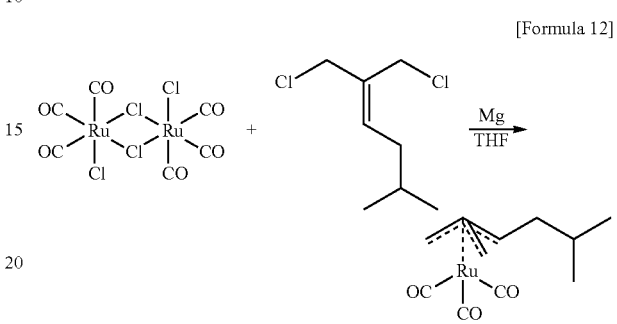

Example 5: Synthesis of ($\eta^4$-2-nonylidene-1,3-propanediyl)tricarbonyl Ruthenium 6.12 g (12.0 mmol) of tricarbonyl-dichlororuthenium dimer was suspended in 200 ml of tetrahydrofuran, and 50 ml of a solution of 6.83 g (28.8 mmol) of 1-chloro-2-(chloromethyl)-2-undecene in tetrahydrofuran was added thereto. To the resultant, 2.2 g (96.0 mmol) magnesium turnings were slowly added, followed by stirring at room temperature for 3 hours. To the resultant reaction mixture, 6 mL of methanol was added for quenching, and the solvent was distilled off under reduced pressure. The thus obtained residue was extracted with 30 mL of pentane three times, and the solvent was distilled off under reduced pressure. The thus obtained oil was purified by distillation to obtain 3.37 g (9.60 mmol) as a target (yield: 40%). The synthesis reaction performed in this example is as follows:

[Formula 13]

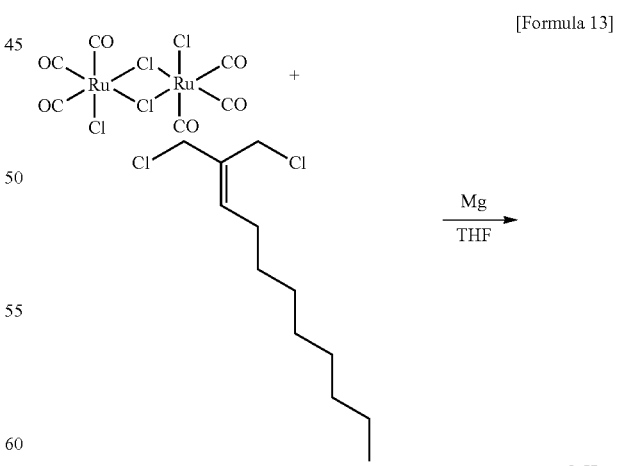

In this manner, it was confirmed in the present embodiment that the organoruthenium compounds having, as the substituent R, hydrogen and the hydrocarbon groups having 1 to 8 carbon atoms can be synthesized.

[Evaluation of Physical Properties]

Regarding the compounds of Example 1 to Example 5 among the organoruthenium compounds synthesized in the present embodiment, various physical properties (a melting point, a decomposition temperature, and a vaporization property) were studied and evaluated.

(I) Study of Melting Point

The organoruthenium compound of each example was subjected to differential scanning calorimetry (DSC) to measure a melting point and a decomposition temperature. The DSC was performed with DSC3500-ASC manufactured by NETZSCH used as a measurement apparatus with the weight of a sample set to 1.0 mg, nitrogen used as a carrier gas, at a scanning rate of 10° C./min, and with a measurement temperature range set to –60° C. to 400° C. The DSC was also performed, for comparison, on (1,3-cyclohexadiene)tricarbonyl ruthenium of the conventional technique (Formula 2 described above; referred to as Comparative Example 1). Results of the DSC of the respective organoruthenium compounds of Example 1 to Example 4 and Comparative Example 1 are illustrated in FIG. 1 to FIG. 5.

As a result of the DSC, a peak corresponding to the melting point was observed at 21.5° C. in the organoruthenium compound of Example 1 (R=hydrogen). On the other hand, in the DSC of the organoruthenium compounds of Example 2 (R=methyl group), Example 3 (R=ethyl group), and Example 4 (R=isobutyl group), no signal corresponding to the melting point was found in the measurement temperature range having a lower limit of –60° C.

It was confirmed, based on the results of the DSC described above, that all of the organoruthenium compounds of the present embodiment can be dealt with in a liquid state at normal temperature (about 25° C.). In addition, it was found that the organoruthenium compounds of Example 2 to Example 4 in which the substituents (ethyl, propyl and isobutyl) are introduced into trimethylenemethane have melting points largely lower than that of Example 1 containing no substituent. It is deemed that the organoruthenium compounds of these examples are compounds capable of further stably retaining the liquid state at normal temperature. It was confirmed that when a hydrocarbon group is introduced into trimethylenemethane, handleability of the raw material for chemical deposition in film formation process can be improved. It is noted that the melting point of the organoruthenium compound of Comparative Example 1 was 24.6° C., which was substantially the same melting point as that of Example 1.

(II) Study of Thermal Stability

Based on the analysis results of the DSC, the decomposition temperature of each organoruthenium compound can be measured. The decomposition temperatures of the respective organoruthenium compounds measured by the DSC are as follows.

TABLE 1

| | Substituent R of L1 | Decomposition temperature |
|---|---|---|
| Example 1 | Hydrogen | 282.2° C. |
| Example 2 | Ethyl group | 243.4° C. |
| Example 3 | Propyl group | 285.8° C. |
| Example 4 | Isobutyl group | 285.2° C. |
| Comparative Example 1 | — | 190.1° C. |

As described above, the decomposition temperature of the conventional compound of (1,3-cyclohexadiene)tricarbonyl ruthenium (Comparative Example 1) is 190.1° C. On the other hand, the organoruthenium compounds of Example 1 to Example 4 in each of which the trimethylenemethane-based ligand ($L_1$) coordinates have higher decomposition temperatures as compared with that of Comparative Example 1, and it is deemed that these compounds are excellent in thermal stability. When Example 1 using hydrogen as the substituent R is compared with Example 2 to Example 4 each having the hydrocarbon group introduced as the substituent, the decomposition temperature is lower than in Example 1 in Example 2 having an ethyl group introduced. The decomposition temperatures are higher in Example 3 having a propyl group introduced and in Example 4 having an isobutyl group introduced. The number of carbon atoms of the substituent varies the decomposition temperature, but a simple trend is not found, and it is presumed that the decomposition temperature is affected also by the presence of a branch chain in the complex, the three-dimensional structure and the like.

(III) Study of Vaporization Property (Vapor Pressure)

Next, regarding the organoruthenium compounds of Example 1 to Example 4, the vaporization property was studied through thermogravimetric-differential thermal analysis (TG-DTA). In the TG-DTA, TG-DTA2000SA manufactured by BRUKER was used, a sample with a weight of 5 mg was filled in an aluminum cell, and change in a calorific value and a weight was observed in a nitrogen atmosphere, at a temperature increase rate of 5° C./min in a measurement temperature range of from room temperature to 500° C. In the study by the TG-DTA, for comparison, the organoruthenium compound of Comparative Example 1 ((1,3-cyclohexadiene)tricarbonyl ruthenium) and dicarbonyl-bis(5-methyl-2,4-hexanediketonato)ruthenium (Formula 5 described above; referred to as Comparative Example 2) also of the conventional technique were subjected to the measurement.

Figure 6:
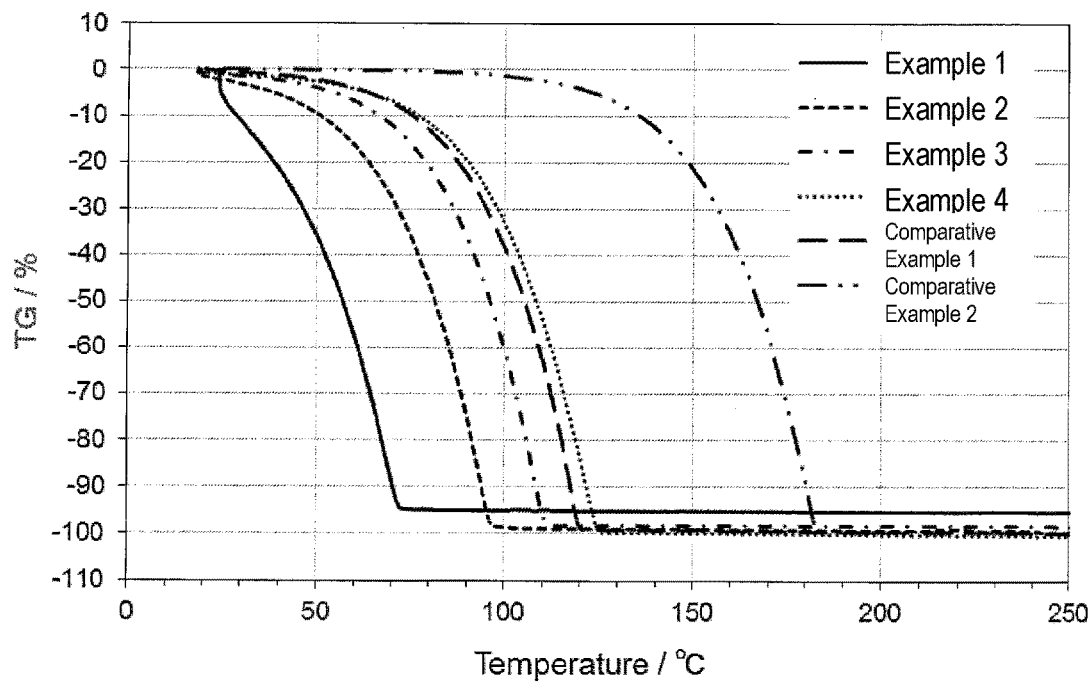
FIG. 6 is a diagram illustrating TG curves of the organoruthenium compounds of Example 1 to Example 4 and Comparative Example 1 and Comparative Example 2.

TG curves of the organoruthenium compounds of Example 1 to Example 4 and Comparative Examples are illustrated in FIG. 6. It is understood that all the organoruthenium compounds of Example 1 to Example 4 in which the trimethylenemethane-based ligands coordinate have higher vapor pressures than that of Comparative Example 2 (dicarbonyl-bis(5-methyl-2,4-hexanediketonato)ruthenium), and rapidly vaporize. Besides, also as compared with Comparative Example 1 ((1,3-cyclohexadiene)tricarbonyl ruthenium), the organoruthenium compounds of Example 1 to Example 3 have higher vapor pressures. It is deemed that Example 4 and Comparative Example 1 are equivalent in the vapor pressure. Accordingly, it is deemed that the organoruthenium compounds of the present embodiment have a good vaporization property from the viewpoint of the vapor pressure.

When Example 1 to Example 4 are compared with one another, the compound of Example 1 in which no hydrocarbon group is introduced as the substituent, and in which trimethylenemethane coordinates has the highest vapor pressure, and easily vaporizes. In other words, it is understood that that when a substituent is introduced and a molecular weight is increased, the vapor pressure is liable to lower. In the TG-DTA measurement of Example 1, however, the sample started to vaporize at the same time as the sample was set, and hence it is deemed that the vapor pressure was rather too high. Therefore, it is presumed that introduction of a substituent into the trimethylenemethane-based ligand may be effective from the viewpoint of vapor pressure adjustment in some cases.

Based on the evaluation results of the physical properties, it was confirmed that the organoruthenium compound of the present invention in which the trimethylenemethane-based ligand coordinates is in the form of a liquid and hence is excellent in handleability, and has a favorable vapor pressure and a useful vaporization property, and on the other hand, has a decomposition temperature of 200° C. or more, and has adequate thermal stability, and hence is suitable as a raw material for chemical deposition.

[Film Formation Test]

The organoruthenium compounds of Example 1 (R=hydrogen) and Example 3 (R=propyl group) of the present embodiment were subjected to a film formation test to study whether or not a ruthenium thin film could be formed. Besides, for comparison, dicarbonyl-bis(5-methyl-2,4-hexanediketonato)ruthenium (Formula 5, Patent Document 4) of a conventional raw material for chemical deposition was also subjected to the film formation test (Comparative Example 2).

With the organoruthenium compound of the present embodiment used as a raw material, a ruthenium thin film was formed with a CVD apparatus (hot wall CVD film forming apparatus). Film forming conditions were as follows:

Substrate material: Si
Carrier gas (nitrogen gas): 10 sccm, 200 sccm
Reaction gas (hydrogen gas): 10 sccm, 200 sccm
Film forming pressure: 30 torr, 50 torr
Film forming time: 15 min, 30 min
Film forming temperature: 190° C., 200° C., 210° C., 230° C., 250° C.

Figure 7:
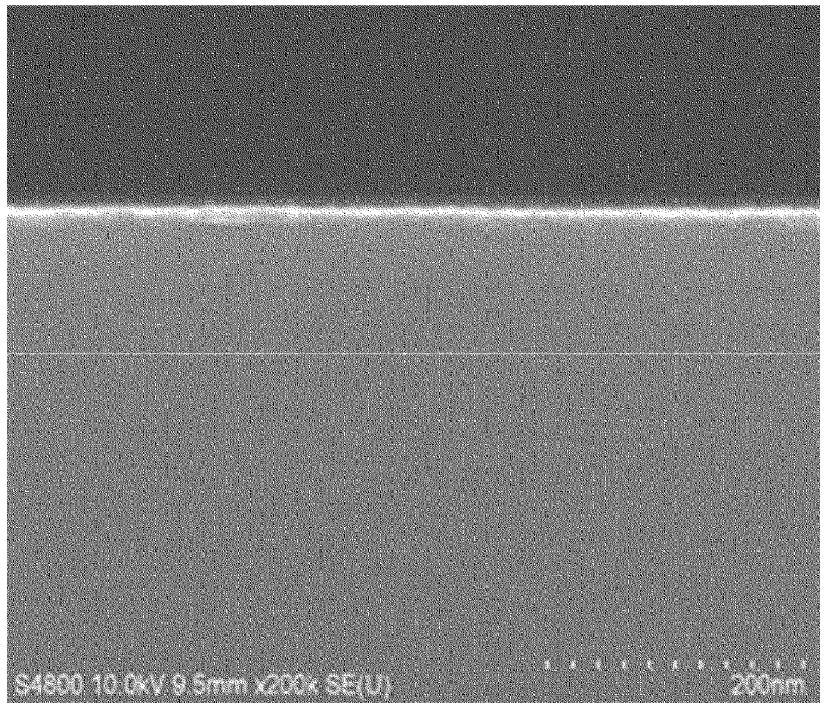
FIG. 7 illustrates an SEM image of a cross section in the thickness direction of a ruthenium thin film of Example 1 formed in First Embodiment (reaction gas: hydrogen)

A ruthenium thin film was formed under the above-described conditions, and a thickness and a resistance value of the resultant were measured. The thickness of the ruthenium thin film was obtained by measuring thicknesses in a plurality portions based on a result of XRF (X-ray reflection fluorescence) using EA1200VX manufactured by Hitachi High-Tech Science Corporation, and calculating an average of the thicknesses. Besides, the resistance value was measured by a four point probe method. Results of the measurement are shown in Table 2. FIG. 6 and FIG. 7 illustrate results of observation, with a scanning electron microscope (SEM), of cross sections in the thickness direction of the ruthenium thin films of Example 1 and Example 3.

Figure 8:
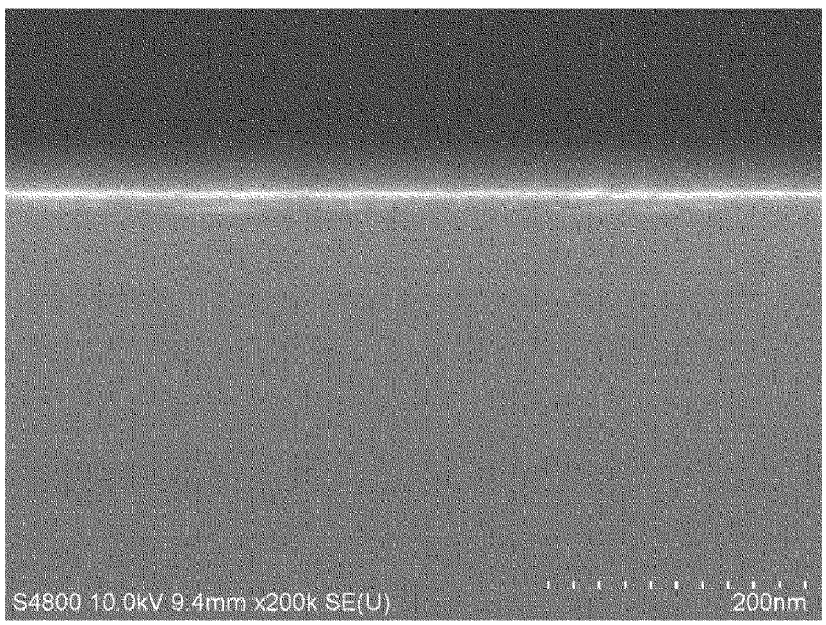
FIG. 8 illustrates an SEM image of a cross section in the thickness direction of a ruthenium thin film of Example 3 formed in First Embodiment (reaction gas: hydrogen)

As illustrated in FIG. 7 and FIG. 8, it can be confirmed that the organoruthenium compounds of Example 1 and Example 3 can form uniform ruthenium thin films having smooth surfaces. Thus, it was confirmed that the organoruthenium compounds of Example 1 and Example 3 can form a ruthenium thin film having a sufficient thickness in a short period of time. Besides, as compared with the film forming conditions for the organoruthenium compound of Comparative Example 2, it is understood that the organoruthenium compound of each example can form a film at a lower temperature. The organoruthenium compound of the present invention has high reactivity with hydrogen used as the reaction gas, and enables efficient film formation.

Besides, regarding the quality of the thin film, it can be confirmed that a high quality ruthenium thin film having largely lower specific resistance as compared with that of Comparative Example 2 is formed. The organoruthenium compound of the present invention does not contain an oxygen atom capable of directly coordinating to ruthenium and have good reactivity with hydrogen or the like differently from the organoruthenium compound of Comparative Example 2 containing the β-diketonato ligand. Therefore, a possibility of oxygen mixture in the ruthenium thin film is low, and hence a high quality ruthenium thin film having low specific resistance can be formed.

Second Embodiment: In this embodiment, the organoruthenium compounds of Example 1 (R=hydrogen), Example 3 (R=propyl group) and Comparative Example 2 of First Embodiment were used as a raw material, and oxygen was applied as the reaction gas to perform a film formation test of a ruthenium thin film. For the film formation, the same CVD apparatus (hot wall CVD film forming apparatus) as that used in First Embodiment was used. Film forming conditions were as follows:

Substrate material: Si
Carrier gas (nitrogen gas): 10 sccm, 50 sccm
Reaction gas (oxygen gas): 10 sccm
Film forming pressure: 1 torr, 2 torr, 3 torr
Film forming time: 15 min, 30 min
Film forming temperature: 190° C., 210° C., 250° C.

A ruthenium thin film was formed under the above-described conditions, and a thickness and a resistance value of the resultant were measured. The methods for measuring the thickness and the resistance value of the ruthenium thin film were the same as those employed in First Embodiment. Results of the measurement are shown in Table 3. Besides, FIG. 9 and FIG. 10 respectively illustrate SEM images of the ruthenium thin films of Example 1 and Example 3.

TABLE 2

| Sample | Substrate material | Nitrogen gas (sccm) | Hydrogen gas (sccm) | Film forming pressure (torr) | Film forming time (min) | Film forming temperature (° C.) | Ru thickness (nm) | Specific resistance (μΩ · cm) |
|---|---|---|---|---|---|---|---|---|
| Example 1 | Si | 10 | 10 | 30 | 15 | 190 | 4.22 | 13.4 |
|  |  |  |  |  |  | 200 | 5.21 | 15.4 |
| Example 3 |  | 200 | 200 | 50 |  | 190 | 2.46 | 34.6 |
|  |  |  |  |  |  | 210 | 4.76 | 40.2 |
|  |  |  |  |  |  | 230 | 7.65 | 43.1 |
| Comparative Example 2 |  | 10 | 200 |  | 30 | 250 | 17.8 | 65.8 |

TABLE 3

| Sample | Substrate material | Nitrogen gas (sccm) | Oxygen gas (sccm) | Film forming pressure (torr) | Film forming time (min) | Film forming temperature (° C.) | Ru thickness (nm) | Specific resistance (μΩ · cm) |
|---|---|---|---|---|---|---|---|---|
| Example 1 | Si | 10 | 10 | 1 | 15 | 190 | 25.3 | 20.2 |
| Example 3 | | 50 | | 3 | | 210 | 24.8 | 25.8 |
| Comparative Example 2 | | 10 | | 2 | 30 | 250 | 21.6 | 46.4 |

Figure 9:
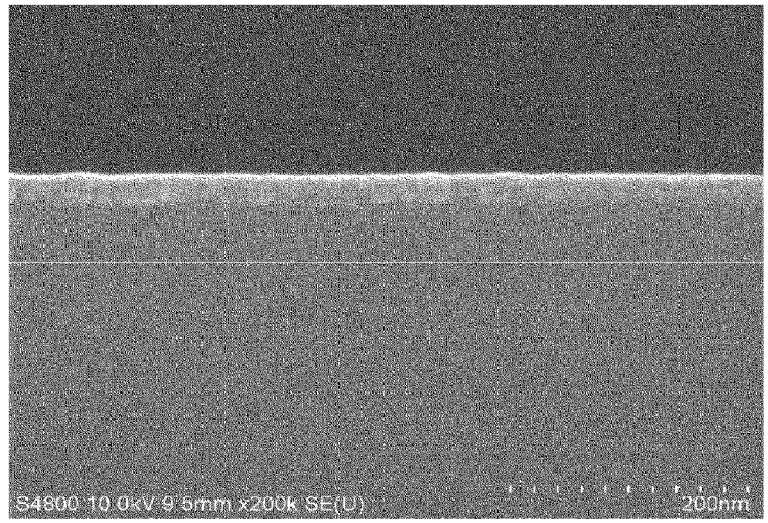
FIG. 9 illustrates an SEM image of a cross section in the thickness direction of a ruthenium thin film of Example 1 formed in Second Embodiment (reaction gas: oxygen)
Figure 10:
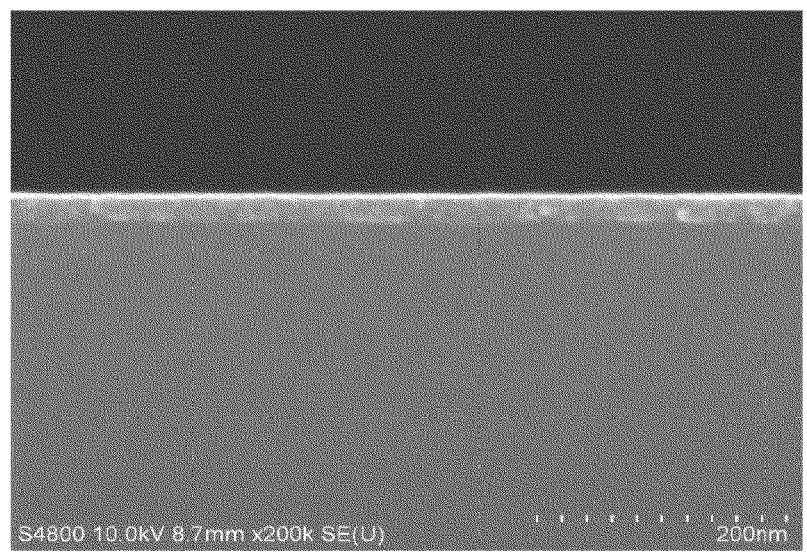
FIG. 10 illustrates an SEM image of a cross section in the thickness direction of a ruthenium thin film of Example 3 formed in Second Embodiment (reaction gas: oxygen).

It is understood, based on Table 3, FIG. 8 and FIG. 9, that the organoruthenium compounds of Example 1 and Example 3 can form a ruthenium thin film even with oxygen used as the reaction gas. Also in the present embodiment, a uniform ruthenium thin film having a smooth surface is formed. Besides, the organoruthenium compounds of Example 1 and Example 3 can form a ruthenium thin film at a lower temperature and a higher deposition rate than the organoruthenium compound of Comparative Example 2. When the thus formed ruthenium thin films are compared in the specific resistance, the ruthenium thin films of Example 1 and Example 3 have specific resistance extremely lower than that of the ruthenium thin film of Comparative Example 2. This is probably because the organoruthenium compounds of Example 1 and Example 3 suppress generation of a ruthenium oxide even with oxygen used as the reaction gas.

INDUSTRIAL APPLICABILITY

An organoruthenium compound contained in a raw material for chemical deposition of the present invention has high thermal stability, and can form a ruthenium thin film even with a reducing gas such as hydrogen used as a reaction gas. Besides, even when oxygen is used as the reaction gas, it can form a good ruthenium thin film. The raw material for chemical deposition of the present invention has a favorable vapor pressure, and is good also in handleability. The present invention is suitable for use as a wiring/electrode material of a semiconductor device such as a DRAM.

What is claimed is:

1. A raw material for chemical deposition for producing a ruthenium thin film or a ruthenium compound thin film by a chemical deposition method, the raw material comprising:
an organoruthenium compound represented by the following Formula 1 and comprising a trimethylenemethane-based ligand ($L_1$) and three carbonyl ligands coordinated to divalent ruthenium:

$$RuL_1(CO)_3 \qquad \text{[Formula 1]}$$

wherein the trimethylenemethane-based ligand $L_1$ is represented by the following Formula 2:

[Formula 2]

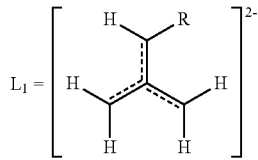

wherein a substituent R of the ligand $L_1$ is any one of a methyl group, an ethyl group, a n-propyl group, an isopropyl group, a n-butyl group, an isobutyl group, a sec-butyl group, a tert-butyl group, a n-pentyl group, an isopentyl group, and a neopentyl group.

2. A chemical deposition method for a ruthenium thin film or a ruthenium compound thin film, comprising vaporizing a raw material containing an organoruthenium compound to obtain a raw material gas, and introducing the raw material gas together onto a substrate surface while heating the gas,
wherein the method uses the raw material for chemical deposition according to claim 1 as the raw material, and uses hydrogen as a reaction gas.

3. The chemical deposition method according to claim 2, wherein the method comprises:
applying a reducing gas as the reaction gas, and
introducing the raw material gas onto the substrate surface together with the reaction gas, and heating the gases.

4. The chemical deposition method according to claim 3, wherein the reducing gas is a gas of any one of hydrogen, ammonia, hydrazine, formic acid, and an alcohol.

5. The chemical deposition method according to claim 2, wherein the method comprises:
applying either of an oxidizing gas and a gas of an oxygen-containing reactant as the reaction gas, and
introducing the raw material gas onto the substrate surface together with the reaction gas, and heating the gases.

6. The chemical deposition method according to claim 5, wherein the oxidizing gas is a gas of any one of oxygen and ozone, and the gas of an oxygen-containing reactant is a gas of any one of water and an alcohol.

7. The chemical deposition method according to claim 2, wherein a film forming temperature is 150° C. or more and 350° C. or less.

8. The chemical deposition method according to claim 3, wherein a film forming temperature is 150° C. or more and 350° C. or less.

9. The chemical deposition method according to claim 4, wherein a film forming temperature is 150° C. or more and 350° C. or less.

10. The chemical deposition method according to claim 5, wherein a film forming temperature is 150° C. or more and 350° C. or less.

11. The chemical deposition method according to claim 6, wherein a film forming temperature is 150° C. or more and 350° C. or less.

* * * * *